United States Patent
Yu et al.

(10) Patent No.: US 9,041,215 B2
(45) Date of Patent: May 26, 2015

(54) SINGLE MASK PACKAGE APPARATUS AND METHOD

(71) Applicant: Taiwan Semiconductor Manufacturing Company, Ltd., Hsin-Chu (TW)

(72) Inventors: Chen-Hua Yu, Hsin-Chu (TW);
Mirng-Ji Lii, Sinpu Township (TW);
Hao-Yi Tsai, Hsin-Chu (TW);
Hsien-Wei Chen, Hsin-Chu (TW);
Hung-Yi Kuo, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/903,740

(22) Filed: May 28, 2013

(65) Prior Publication Data

US 2014/0264927 A1    Sep. 18, 2014

Related U.S. Application Data

(60) Provisional application No. 61/778,196, filed on Mar. 12, 2013.

(51) Int. Cl.
*H01L 21/768* (2006.01)
*H01L 23/532* (2006.01)
*H01L 23/498* (2006.01)
*H01L 21/48* (2006.01)
*H01L 23/525* (2006.01)

(52) U.S. Cl.
CPC .... *H01L 21/76829* (2013.01); *H01L 23/49816* (2013.01); *H01L 23/49822* (2013.01); *H01L 21/4853* (2013.01); *H01L 23/525* (2013.01); *H01L 2224/13* (2013.01)

(58) Field of Classification Search
CPC ............... H01L 21/4853; H01L 24/10; H01L 24/11–24/15; H01L 24/18; H01L 24/81; H01L 2224/02333; H01L 2224/023; H01L 2224/10; H01L 2224/1182; H01L 2224/81355
USPC ......................................... 438/612, 622, 623
See application file for complete search history.

(56) References Cited

U.S. PATENT DOCUMENTS

| 7,795,127 B2 * | 9/2010 | Yamano ...................... 438/613 |
| 8,362,612 B1 * | 1/2013 | Paek et al. ................... 257/737 |
| 2001/0020737 A1 | 9/2001 | Kwon et al. |

(Continued)

FOREIGN PATENT DOCUMENTS

| KR | 100298827 | 11/2001 |
| KR | 100979497 | 9/2010 |

*Primary Examiner* — Peniel M Gumedzoe
(74) *Attorney, Agent, or Firm* — Slater & Matsil, L.L.P.

(57) ABSTRACT

Disclosed herein is a single mask package apparatus on a device comprising a first substrate having a land disposed on a first surface, a stud disposed on the land and a protective layer disposed over the first surface of the first substrate and around the stud. The protective layer may optionally have a thickness of at least 3 μm. A PPI may be disposed over the protective layer and in electrical contact with the stud, with a first portion of the PPI extending laterally from the stud. An interconnect may be disposed on and in electrical contact with the first portion of the PPI, and a second substrate mounted on the interconnect. A molding compound may be disposed over the PPI and around the interconnect. The stud may be a substantially solid material having a cylindrical cross section and may optionally be wirebonded to the land.

20 Claims, 4 Drawing Sheets

(56) References Cited

U.S. PATENT DOCUMENTS

| | | | |
|---|---|---|---|
| 2002/0175409 A1* | 11/2002 | Tsubosaki | 257/737 |
| 2005/0176233 A1* | 8/2005 | Joshi et al. | 438/613 |
| 2009/0001570 A1* | 1/2009 | Yamano | 257/737 |
| 2009/0045513 A1* | 2/2009 | Kim et al. | 257/738 |
| 2009/0309216 A1 | 12/2009 | Jeon et al. | |

* cited by examiner

SINGLE MASK PACKAGE APPARATUS AND METHOD

This application claims the benefit of U.S. Provisional Application No. 61/778,196, filed on Mar. 12, 2013, entitled "Single Mask Package Apparatus and Method," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductor layers of material over a semiconductor substrate, and patterning the various material layers using lithography to form circuit components and elements thereon.

Interconnects may be formed to join two substrates. An array of interconnects may be deposited on the bonding pads of a first substrate, and with a second substrate joined at its own bonding pad sites to the first substrate via the interconnects. For example, interconnects may be solder balls formed on a pad and then reflowed to attach a second substrate. The interconnects may be formed with a layout different from the land layout to permit customization of the output layout. This may be accomplished with metal lines disposed in a dielectric, with one or more metal layers overlying the lands and connected to the lands by vertical conductive plating layers.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to illustrate the relevant aspects of the embodiments and are not necessarily drawn to scale.

DETAILED DESCRIPTION

The making and using of the presented embodiments are discussed in detail below. It should be appreciated, however, that the present disclosure provides many applicable concepts that can be embodied in a wide variety of specific contexts. The specific embodiments discussed are merely illustrative of specific ways to make and use the described conductive post-passivation interconnect (PPI) for a wafer level chip scale package (WLCSP) structure, and do not limit the scope of the disclosure.

Embodiments will be described with respect to a specific context, namely making and using interconnects useful in, for example, PPI and WLCSP assemblies. Other embodiments may also be applied, however, to other electrically connected components, including, but not limited to, package-on-package assemblies, die-to-die assemblies, wafer-to-wafer assemblies, die-to-substrate assemblies, in assembling packaging, in processing substrates, interposers, substrates, or the like, or mounting input components, boards, dies or other components, or for connection packaging or mounting combinations of any type of integrated circuit or electrical component.

The embodiments of the present disclosure are described with reference to FIGS. 1 through 10, and variations of the embodiments are also discussed. Throughout the various views and illustrative embodiments of the present disclosure, like reference numbers are used to designate like elements. Additionally, the drawings are intended to be illustrative, are not to scale and not intended to be limiting. Note that, for simplification, not all element numbers are included in each subsequent drawing. Rather, the element numbers most pertinent to the description of each drawing are included in each of the drawings.

Figure 1:
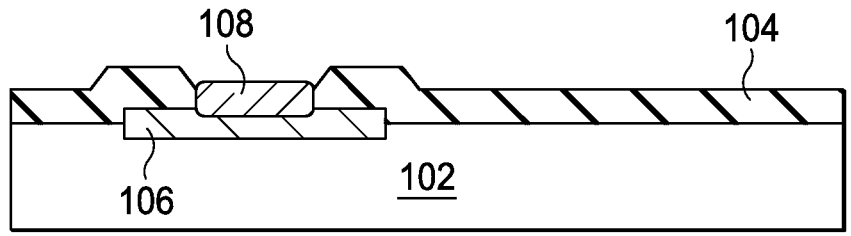
FIGS. 1 through 8 illustrate cross-sectional views of intermediate steps in forming a single mask interconnect according to an embodiment.

FIG. 1 is a cross-sectional view illustrating a substrate 102 with a land 106 according to an embodiment. The substrate 102, such as a chip, die, package or other carrier, may have a conductive land 106 disposed therein. A passivation layer 104 may be disposed on the substrate 102 and a portion of the land 106.

While one substrate 102 is shown in the drawings, several substrates 102 may optionally be processed on a workpiece such as a wafer, and the workpiece may be singulated during a subsequent process step. The substrate 102 may have one or more active devices formed thereon, and the land 106 may be electrically connected to one of the active devices. For example, the substrate 102 may be a processor die, and the land 106 may connect to one or more transistors of the processor core to act as an input or output for the processor. Additionally, while not shown, the substrate 102 may comprise one or more interlayer dielectric layers, intermetal layers, insulator layers, redistribution layers or another suitable substrate layer.

In one embodiment, the land 106 may be copper (Cu), but may in other embodiments, may be polysilicon, gold (Au), aluminum (Al), tantalum (Ta), tungsten (W), or another suitable conductive material or compound. A passivation layer 104 may be formed over the surface of the substrate to passivate the components of the substrate 102 by electrically insulating component structures and preventing oxidation or other chemical reactions from degrading performance of the components. The passivation layer 104 may have an opening exposing at least a portion of the land 106, permitting the land 106 to make electrical contact with subsequent layers. In an embodiment, the passivation layer 104 may be an oxide or nitride such as silicon dioxide ($SiO_2$) or silicon nitride (SiN) or another material such as silicon carbide (SiC), titanium nitride (TiN) or the like.

A coating layer 108 may optionally be formed on the land 106. In an embodiment, the coating layer 108 may be an electroless nickel electroless palladium (ENEP) layer. In ENEP plating, a nickel layer is deposited over a surface, followed by a palladium layer on the nickel layer. Each electroless plating steps may comprise a bath of a metal with a reducing agent, which causes a metal layer to form without application of an electric current, as in electroplating. The ENEP coating layer 108 provides protection against corrosion, oxidation or contaminants of the land 106 and a stronger bond for a subsequently bonded structure. The coating layer 108, may, in another embodiment, be an organic solder preservative (OSP), another metallic coating, such as an electroplated coating, or the like.

Figure 2:
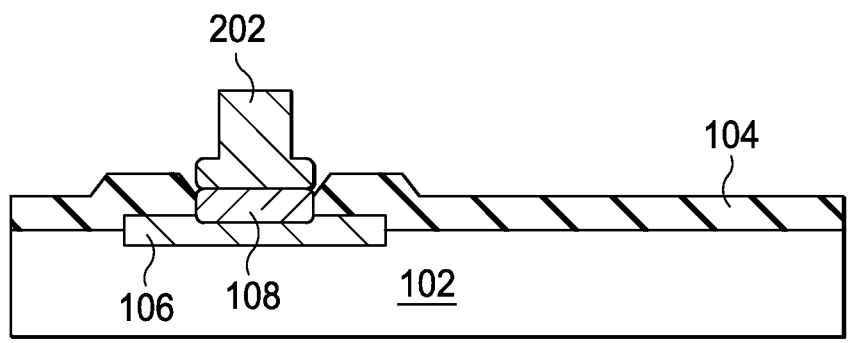

FIG. 2 is a cross-sectional view illustrating application of a stud 202 to the land 106. The stud 202 may be bonded to the land 106 or coating layer 108 without masking and deposition. It has been discovered that a substantially solid material may be bonded directly to the land 106 or coating layer 108 to create a conductive structure without masking to form the stud 202. This results in a more rapid and cost-effective fabrication process.

In an embodiment, the stud 202 may be a wire bonded structure. For example, a copper wire may be wire bonded to the land 106 or to the coating layer 108 where employed. In such an example, a wirebonder head may wedge bond or ball bond a copper wire using a combination of heat, pressure and ultrasonic energy to fuse the copper wire to the land 106 or coating layer 108 and then cut the wire to length, forming the stud 202. In another embodiment, the stud 202 may be a pre-fabricated pillar or cylinder that is placed on the land 106 and attached by, for example, soldering or fusing. Additionally, while the foregoing examples describe the stud 202 as copper, the stud 202 may be aluminum, palladium (Pd), gold, tungsten (W), silver (Ag), or another conductive material or alloy. In an embodiment, the stud 202 may be cylindrical or have a cylindrical cross section. The stud 202 may have a cross section size varying according to the power requirements of devices disposed on the substrate, the height of the stud 202, the material of the stud 202, or another factor. In an embodiment, the stud 202 may have a round cross section with a diameter greater than about 20 µm, and in an embodiment, may have a diameter of about 30 µm.

Figure 3:
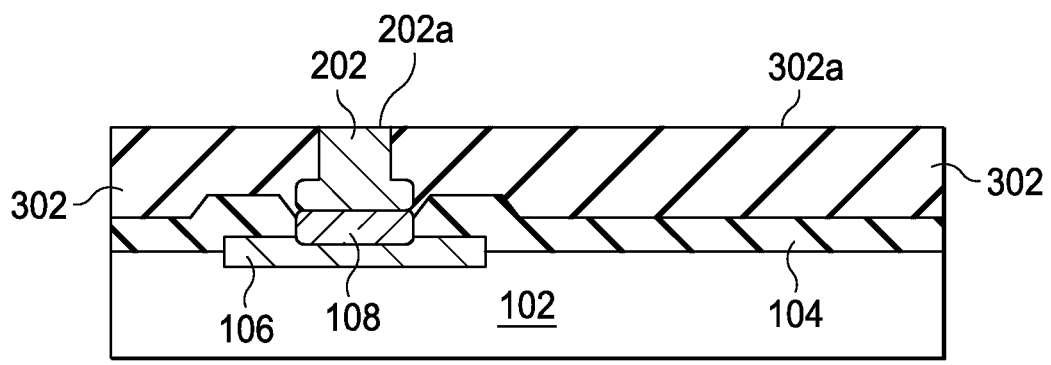

FIG. 3 is a cross-sectional view illustrating application of a protective layer 302 according to an embodiment. The protective layer 302 may be formed around the stud 202 so that masking or etching of the protective layer 302 is avoided. The stud top surface 202a and protective layer top surface 302a may be planarized after the protective layer 302 is deposited. For example, a chemical-mechanical polish (CMP) may be used to planarize the protective layer top surface 302a and stud top surface 202a in a single procedure.

In an embodiment, the protective layer 302 may be a polymer such as a polyimide, a polybenzoxazole (PBO), benzocyclobutene (BCB), epoxy, liquid molding compound, or the like. The protective layer 302 may provide protection and support for the stud 202 while insulating the underlying layer and preventing parasitic capacitance or interference between conductive structures in the substrate or overlying the protective layer 302. The protective layer 302 may be formed from a high-k dielectric material, and in an embodiment, may have a k-value of about 2.9 or higher. The protective layer 302 may have a thickness dependent on the application of the device, and in an embodiment, the thickness of the protective layer 302 may be about 3 µm or greater.

Figure 4:
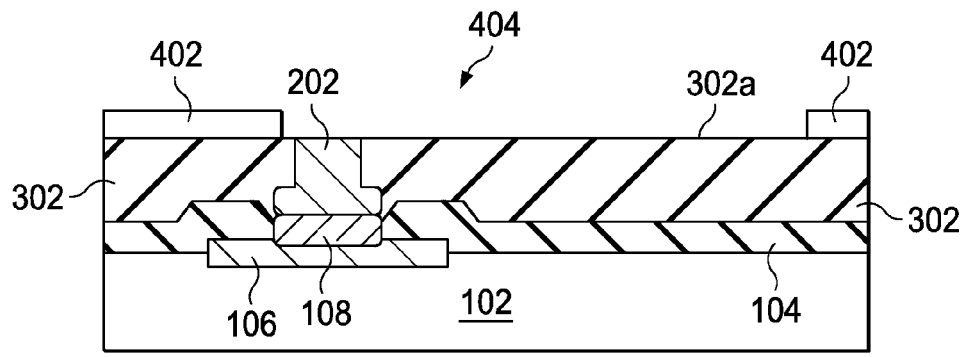

FIG. 4 illustrates formation of a first mask 402 on the protective layer 302 according to an embodiment. The mask 402 may be a photoresist patterned and developed to form one or more mask openings 404.

Figure 5:
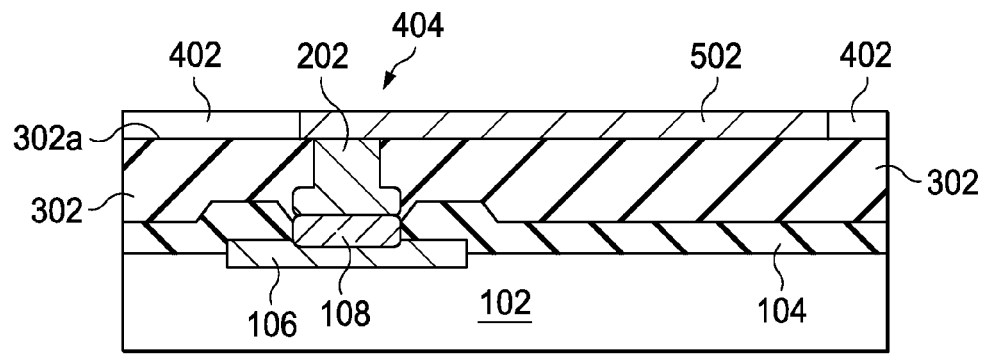

FIG. 5 illustrates formation of a post-passivation interconnect (PPI) layer 502 according to an embodiment. In such an embodiment, the PPI layer 502 may be a metal layer formed in the mask openings 404 and over the top surface 302a of the protective layer 302. The PPI layer 502 may extend laterally from the stud 202 to an area non-aligned with the stud 202.

The PPI layer 502 may be formed to contact or otherwise be in electrical contact with the stud 202. The PPI layer 502 may have a mounting pad, land, or other structure for mounting an interconnect (602, FIG. 7). The PPI layer 502 may be formed from copper in an embodiment, or another conductive material, such as gold, aluminum, silver, tungsten, palladium, or another metal, alloy or conductive material. The PPI layer 502 may be deposited via a vapor deposition method such as chemical vapor deposition (CVD) or plasma enhanced CVD (PECVD), or by electroplating, atomic layer deposition (ALD), or the like. Forming the PPI layer 502 may also comprise forming an initial barrier layer, seed layer or the like, and forming the body of the PPI layer 502 over the initial layer.

Figure 6:
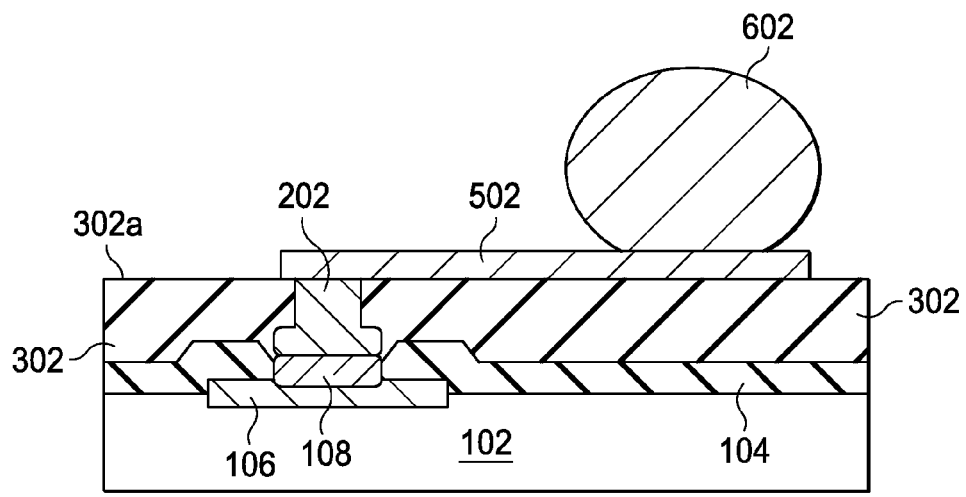

FIG. 6 is a cross-sectional view illustrating exposure of the PPI layer 502 and mounting of an interconnect 602. In an embodiment, the mask 402 may be removed, and an interconnect 602 applied to the PPI layer 502. The interconnect 602 may be a metal such as solder, but may also be another metal, such as gold, aluminum, lead (Pb), silver, tungsten, tin (Sn), or another metal or alloy. In another embodiment, the interconnect 602 may be a conductive material such as solder paste, a conductive epoxy or polymer.

In an embodiment, the interconnect 602 may be formed on a portion of the PPI layer 502 that is non-aligned with the stud 202. In such an embodiment, the interconnect 602 may be non-aligned with the stud 202, permitting an array of interconnects 602 to have a layout different from the layout of a plurality of lands 106.

Figure 7:
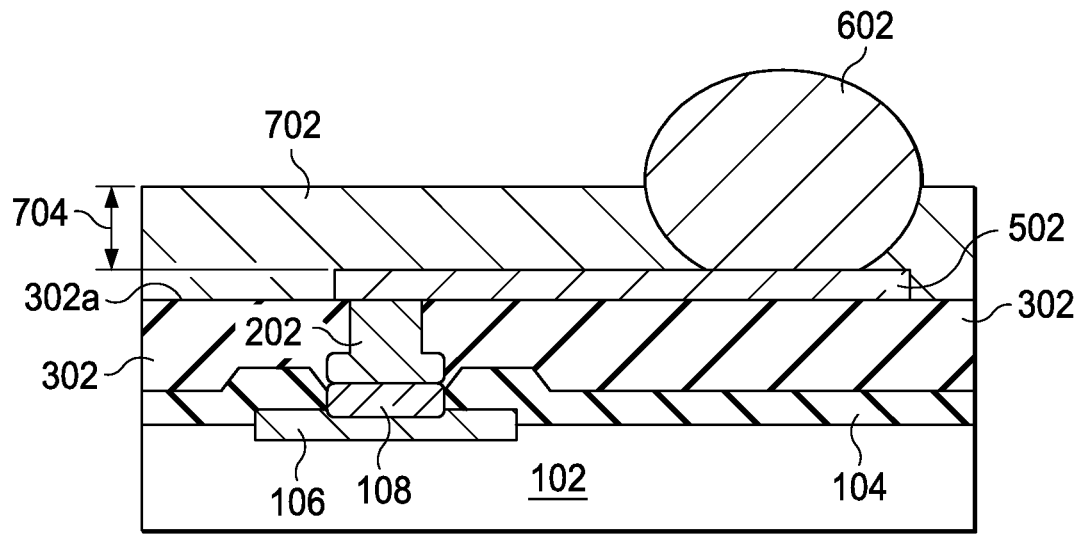

FIG. 7 is a cross-sectional view illustrating application of a molding compound 702. In one embodiment, the molding compound 702 may be a nonconductive material, such as an epoxy, a resin, a moldable polymer, or the like. In an embodiment, the molding compound 702 may be formed over a lower portion of the interconnect 602 and so that a portion of the interconnect 602 extends above the molding compound 702. In an embodiment, the molding compound 702 may be formed to support or protect the interconnect 602 in later processing steps.

In an embodiment, the molding compound 702 may be applied while substantially liquid, and then may be cured through a chemical reaction, such as in an epoxy or resin. In another embodiment the molding compound 702 may be an ultraviolet (UV) cured polymer applied as a gel or malleable solid capable of being disposed on the protective layer 302 and around, or conforming to, the surface of the interconnect 602.

In another embodiment, the molding compound 702 may be applied as a film, sheet or other structure that may be applied to cover and protect at least a portion of the interconnect 602. For example, the molding compound may be a non-conductive film and may be applied with an adhesive. The molding compound 702 may comprise one or more layers of material applied individually, or in one or more groups. In an embodiment, the molding compound 702 may be a dry film having an adhesive on a side and may adhere to the PPI layer 502 when applied. The molding compound 702 may comprise a non-adhesive dry film layer and an adhesive layer. The molding compound 702 may also be a non-adhesive dry film that is applied over the PPI layer 502 and activated or cured using an external process such as a thermal compression bonding (TCB) process, UV curing, solvent, or the like.

The interconnect 602 may extend laterally past the region where the interconnect 602 contacts the PPI layer 502. The overhanging interconnect 602 results in the molding compound 702 extending under a portion of the interconnect 602, and the molding compound 702 contacting the PPI layer 502 under the interconnect 602.

The molding compound has a thickness 704 determined or calculated based on the height of the interconnect 602. For example, an interconnect 602 may be applied to have a height of 100 µm. Molding compound 702 applied to such a may have thickness 704 of about 50 µm, resulting in the interconnect 602 having an exposed portion with a height of about 50 µm, with the molding compound 702 extending about halfway up the sidewall of the interconnect 602.

A plasma cleaning process may optionally be applied to the interconnect 602. In an embodiment, the plasma clean process may be an oxygen plasma and may be used to clean the interconnect 602 and remove any residual molding compound 702 on the interconnect 602. The plasma clean process may also remove a portion of the top surface of the molding compound 702. Therefore, the molding compound 702 may be applied with an initial thickness sufficient to compensate for material loss due to the plasma clean.

Figure 8:
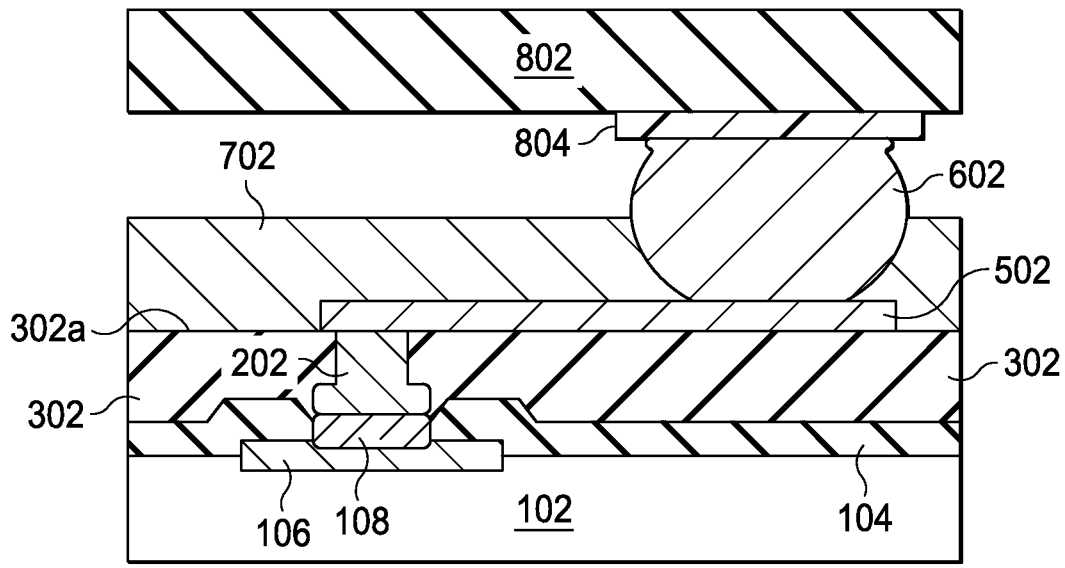

FIG. 8 is a cross-sectional view illustrating mounting of a second substrate 802 on the interconnect 602. The second substrate 802 may be mounted and the interconnect 602 activated to attach to the second substrate 802, thereby forming an electrical connection between the first substrate 102 and the second substrate 802. In an embodiment, the second substrate 802 may have lands 804, which may be joined to the interconnect 602. In an embodiment, the second substrate 802 may be a die, wafer, interposer, or another electrical component. An underfill may also be formed between the second substrate 802 and the molding compound 702.

Figure 9:
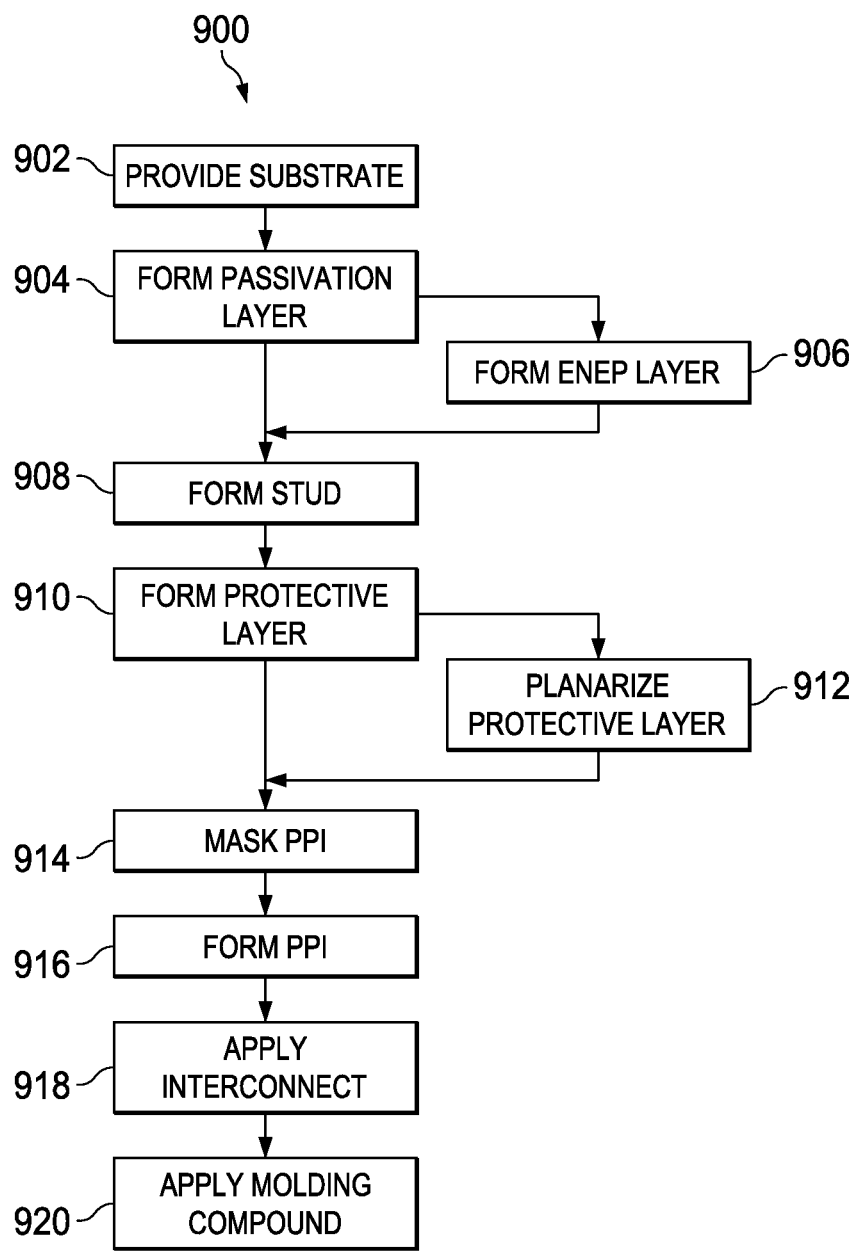
FIG. 9 is a flow diagram illustrating a method for forming a single mask interconnect according to an embodiment.

FIG. 9 is a flow diagram illustrating a method 900 for forming an interconnect 602 according to an embodiment. A substrate may be provided in block 902, and the substrate may have one or more lands disposed thereon. A passivation layer may be formed in block 914, the passivation layer formed over the substrate and, optionally, over a portion of the lands. A coating layer may optionally be formed in block 906. The coating layer may be formed on a portion of the lands and in an opening of the passivation layer. In block 908, a stud may be formed on the land, and on the coating layer or ENEP layer, where included. The stud may be formed by, for example, wirebonding, or may be formed prior to placement and bonding. In block 910, a protective layer may be formed over the passivation and around the stud. The top surfaces of the stud and of the protective layer may optionally be planarized in block 912. A mask for the PPI layer may be formed in block 914, and the PPI may be formed in block 916. The mask may be removed, and an interconnect applied to the PPI layer in block 918. A molding compound may be applied over the PPI layer and around the interconnect in block 920. Additional processing steps, such as mounting a second substrate or the like, may be subsequently performed.

A method of forming an interconnect may comprise mounting a stud on a land disposed on a substrate, forming a protective layer over the substrate and around the stud, forming a first mask over the protective layer. A metal layer may be formed in the mask and over the protective layer in electrical contact with the stud. An interconnect may be applied to the metal layer. The stud may be a substantially solid material, and may be formed from copper wire. A wire may be wirebonded to the land and cutting the wire to form the stud. The method may further comprise planarizing a top surface of the stud and of the protective layer prior to forming the metal layer. A coating layer may be formed on the land prior to mounting the stud on the land. A second substrate may be mounted on the interconnect. A molding compound may be applied over the metal layer and around the interconnect. A passivation layer may be formed prior to mounting the stud on the land, with the passivation layer formed over the substrate and over a portion of the land.

A device according to an embodiment may comprise a stud disposed on a land on a substrate, a protective layer disposed over the substrate and around the stud, a metal layer disposed over the protective layer and in electrical contact with the stud, and an interconnect disposed on and in electrical contact with the metal layer. The protective layer may have a top surface substantially coplanar with a top surface of the stud. The interconnect may be non-aligned with the stud. A molding compound may be disposed over the metal layer and around the interconnect. A passivation layer may be disposed on the substrate and over at least a portion of the land. The land may comprise a coating layer that is optionally an electroless nickel electroless palladium layer. The stud may be wirebonded to the land and may be a substantially solid material and have a diameter of at least 20 µm.

According to another embodiment, a single mask package apparatus may be embodied by a device comprising a first substrate having a land disposed on a first surface, a stud disposed on the land and a protective layer disposed over the first surface of the first substrate and around the stud. The protective layer may optionally have a thickness of at least 3 µm. A PPI may be disposed over the protective layer and in electrical contact with the stud, with a first portion of the PPI extending laterally from the stud. An interconnect may be disposed on and in electrical contact with the first portion of the PPI, and a second substrate mounted on the interconnect. A molding compound may be disposed over the PPI and around the interconnect. The stud may be a substantially solid material having a cylindrical cross section and may optionally be wirebonded to the land.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, and composition of matter, means, methods or steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming an interconnect, comprising:
   mounting a stud on a land disposed on a substrate;
   forming a protective layer over the substrate and around the stud;
   planarizing a top surface of the stud and a top surface of the protective layer;
   forming a first mask over the protective layer, wherein the first mask directly contacts the protective layer;
   forming a metal layer in the mask, and over the protective layer and in electrical contact with the stud;
   applying an interconnect to the metal layer; and
   applying a molding compound after applying the interconnect, wherein the molding compound extends over the metal layer and wherein the molding compound directly contacts the interconnect and the top surface of the protective layer.

2. The method of claim 1, wherein the interconnect is non-aligned with the stud.

3. The method of claim 1, wherein the stud is formed from copper wire.

4. The method of claim 1, wherein mounting the stud comprises wirebonding a wire to the land and cutting the wire to form the stud.

5. The method of claim 1, further comprising forming a passivation layer prior to mounting the stud on the land, the passivation layer formed over the substrate and over a portion of the land.

6. The method of claim 1, further comprising forming a coating layer on the land prior to mounting the stud on the land.

7. The method of claim 1, further comprising mounting a second substrate on the interconnect.

8. The method of claim 7, wherein the molding compound is in direct contact with a top surface of the metal layer; and
wherein the molding compound extends around the interconnect.

9. The method of claim 1, wherein the stud is a pre-fabricated metallic pillar.

10. A method of forming an interconnect, comprising:
providing a substrate having a land disposed on a first side;
mounting a stud on the land, wherein the stud is a pre-fabricated metallic pillar;
forming a protective layer over the substrate and around the stud after mounting the stud;
planarizing a top surface of the stud and a top surface of the protective layer;
forming a post-passivation interconnect (PPI) layer using a mask, the PPI layer disposed over the protective layer in electrical contact with the stud;
forming an interconnect on the PPI layer; and
applying a molding compound over the PPI layer and around the interconnect after forming the interconnect;
wherein a portion of the molding compound extends below a top surface of the PPI layer and directly contacts the top surface of the protective layer.

11. The method of claim 10, further comprising forming a passivation layer prior to mounting the stud on the land, the passivation layer formed over the substrate and over a portion of the land.

12. The method of claim 10, further comprising forming a coating layer on the land and mounting the stud on the coating layer.

13. The method of claim 10, wherein the interconnect is non-aligned with the land.

14. The method of claim 13, wherein the molding compound directly contacts the PPI layer and the interconnect; and
wherein the molding compound extends only partially up a sidewall of the interconnect.

15. A method, comprising:
mounting a stud on a land disposed on a substrate, wherein the stud comprises a substantially solid conductive material and wherein the stud has a substantially cylindrical upper portion;
forming a protective layer over the substrate and over the land, wherein a top surface of the protective layer is substantially level with a top surface of the stud after forming the protective layer;
forming an interconnect layer over the protective layer, the interconnect layer in electrical contact with the stud and extending laterally such that a first portion of the interconnect layer is disposed outside of a region directly over the land, wherein forming the interconnect layer comprises forming a mask in direct contact with the protective layer;
mounting an interconnect on the first portion of the interconnect layer; and
applying a molding compound over the interconnect layer and around the interconnect after mounting the interconnect;
wherein a bottommost surface of the interconnect layer is at a topmost surface of the protective layer;
wherein the molding compound directly contacts sidewalls of the interconnect; and
wherein the molding compound extends laterally over, and in direct contact with, a topmost surface of the interconnect layer, and extends below the topmost surface of the interconnect layer and directly contacts the topmost surface of the protective layer.

16. The method of claim 15, wherein mounting the stud comprises wirebonding a wire to the land and cutting the wire to form the stud.

17. The method of claim 15, further comprising:
forming a passivation layer over the substrate and over a portion of the land;
wherein an opening in the passivation layer exposes a portion of the land; and
wherein mounting the stud comprises mounting the stud in the opening and on the land.

18. The method of claim 17, further comprising:
forming a coating layer on the land using a electroless procedure;
wherein mounting the stud comprises mounting the stud on the coating layer.

19. The method of claim 15, wherein the molding compound extends only partially up the sidewall of the interconnect.

20. The method of claim 18, wherein the coating layer is an electroless nickel electroless palladium (ENEP) layer, an organic solder preservative (OSP), or a combination thereof.

* * * * *